US012700716B2

(12) United States Patent
Yoshimura et al.

(10) Patent No.: US 12,700,716 B2
(45) Date of Patent: Aug. 4, 2026

(54) OPTICAL TRANSMITTER

(71) Applicants: Sumitomo Electric Industries, Ltd., Osaka (JP); Sumitomo Electric Device Innovations, Inc., Yokohama (JP)

(72) Inventors: Satoshi Yoshimura, Osaka (JP); Masanobu Kawamura, Yokohama (JP); Kazushige Oki, Yokohama (JP); Kuniyuki Ishii, Yokohama (JP); Fumihiro Nakajima, Yokohama (JP); Kazunobu Kobayashi, Osaka (JP)

(73) Assignees: Sumitomo Electric Industries, Ltd.; Sumitomo Electric Device Innovations, Inc.

( * ) Notice: Subject to any disclaimer, the term of this patent is extended or adjusted under 35 U.S.C. 154(b) by 1088 days.

(21) Appl. No.: 17/779,681

(22) PCT Filed: Jun. 11, 2021

(86) PCT No.: PCT/JP2021/022325
§ 371 (c)(1),
(2) Date: Feb. 13, 2023

(87) PCT Pub. No.: WO2021/251487
PCT Pub. Date: Dec. 16, 2021

(65) Prior Publication Data
US 2024/0154386 A1 May 9, 2024

(30) Foreign Application Priority Data
Jun. 12, 2020 (JP) ................................. 2020-102401

(51) Int. Cl.
*H01S 5/0683* (2006.01)
*H01S 5/0239* (2021.01)

(52) U.S. Cl.
CPC .......... *H01S 5/0683* (2013.01); *H01S 5/0239* (2021.01)

(58) Field of Classification Search
CPC ........ H01S 5/0239; H01S 5/0683; H01S 3/23; H01S 3/10; H01S 3/09; H01S 3/05;
(Continued)

(56) References Cited

U.S. PATENT DOCUMENTS 5,434,426 A * 7/1995 Furuyama ................ G02B 6/43
250/214 LS
5,936,725 A * 8/1999 Pike ........................ G02B 17/02
348/125
(Continued)

FOREIGN PATENT DOCUMENTS

JP 2005-033037 A 2/2005
JP 2008-166730 A 7/2008
(Continued)

*Primary Examiner* — Omar S Ismail
(74) *Attorney, Agent, or Firm* — Volpe Koenig

(57) ABSTRACT

An optical transmitter according to one embodiment includes: a plurality of light emitting elements; a plurality of light receiving elements that monitor output lights from the respective plurality of light emitting elements; a housing that mounts the plurality of light emitting elements and the plurality of light receiving elements; and a wiring board which is mounted on the housing and which is provided with a first region having a pad electrically connected to the light emitting element and a second region disposed at a position lower than the first region and having a pad electrically connected to the light receiving element.

17 Claims, 14 Drawing Sheets

(58) Field of Classification Search

CPC ..... H01S 5/00; H01S 5/02; H01S 5/04; H01S 5/06; H01S 5/10; H01S 5/20; H01S 5/30; H01S 5/40; H01S 5/50

See application file for complete search history.

(56) References Cited

U.S. PATENT DOCUMENTS

| | | | | |
|---|---|---|---|---|
| 6,122,232 A * | 9/2000 | Schell | G11B 7/0943 | 369/44.14 |
| 6,479,833 B1 * | 11/2002 | Pfefferseder | G08B 17/113 | 250/573 |
| 6,480,647 B1 * | 11/2002 | Kitamura | G02B 6/4204 | 385/47 |
| 6,577,341 B1 * | 6/2003 | Yamada | H04N 23/84 | 348/E9.01 |
| 6,678,480 B1 * | 1/2004 | Aoki | G02B 6/4286 | 398/183 |
| 8,027,552 B2 | 9/2011 | McNie | G02B 6/4201 | 385/132 |
| 9,628,190 B2 * | 4/2017 | Urino | H04B 10/50 | |
| 2002/0048436 A1 * | 4/2002 | Nishikawa | G02B 6/4224 | 385/83 |
| 2002/0064333 A1 * | 5/2002 | Shigeta | H01S 5/02216 | 385/88 |
| 2002/0136249 A1 * | 9/2002 | Akashi | H01S 5/0687 | 372/38.01 |
| 2002/0141721 A1 * | 10/2002 | Kato | G02B 6/43 | 385/24 |
| 2004/0086240 A1 * | 5/2004 | Togami | H05K 1/144 | 385/88 |
| 2007/0171772 A1 * | 7/2007 | Oshima | G11B 23/0042 | 369/14 |
| 2007/0182956 A1 * | 8/2007 | Huber | B07C 5/3416 | 356/237.1 |
| 2007/0223939 A1 * | 9/2007 | Arimoto | H01S 5/026 | 398/198 |
| 2009/0010652 A1 * | 1/2009 | Iwafuji | H10W 90/00 | 398/135 |
| 2011/0033192 A1 * | 2/2011 | Daiber | G02B 6/4256 | 398/183 |
| 2012/0301156 A1 * | 11/2012 | Thompson | G02B 6/4271 | 398/188 |
| 2013/0013252 A1 * | 1/2013 | Ono | G01B 11/24 | 702/167 |
| 2013/0163629 A1 * | 6/2013 | Lee | G02B 6/3845 | 372/44.01 |
| 2014/0061431 A1 * | 3/2014 | Fukagawa | H10F 39/024 | 250/206 |
| 2014/0126917 A1 * | 5/2014 | Sato | H04B 10/40 | 398/182 |
| 2014/0320609 A1 * | 10/2014 | Stettner | H04N 23/55 | 348/47 |
| 2015/0016772 A1 * | 1/2015 | Arao | G02B 6/4284 | 385/14 |
| 2015/0162990 A1 * | 6/2015 | Daiber | H01S 5/02216 | 398/183 |
| 2018/0031787 A1 * | 2/2018 | Okada | G02B 6/4246 | |
| 2018/0287705 A1 * | 10/2018 | Lin | G02B 6/12004 | |
| 2018/0337319 A1 | 11/2018 | Migita | | |
| 2019/0099903 A1 * | 4/2019 | Goto | B25J 9/161 | |
| 2020/0049908 A1 * | 2/2020 | Iwaisako | G02B 6/4245 | |
| 2021/0063818 A1 * | 3/2021 | Yamashita | G02F 1/133607 | |
| 2021/0285619 A1 * | 9/2021 | Nishimoto | G02B 27/0972 | |

FOREIGN PATENT DOCUMENTS

| | | |
|---|---|---|
| JP | 2013-153136 A | 8/2013 |
| JP | 2018-532250 A | 11/2018 |
| JP | 2018-195752 A | 12/2018 |
| WO | 2017/003531 A1 | 1/2017 |

* cited by examiner

OPTICAL TRANSMITTER

TECHNICAL FIELD

The present disclosure relates to optical transmitters.

This application claims priority based on Japanese Application No. 2020-102401 filed on Jun. 12, 2020, which incorporates the entire contents described in the Japanese application.

BACKGROUND ART

Patent Literature 1 describes a semiconductor light emitting module. The semiconductor light emitting module includes a semiconductor light emitting module main portion including a semiconductor light emitting element and a housing for accommodating the semiconductor light emitting module main portion. The housing is an airtight hermetic type storage body, and an optical element is mounted inside the storage body.

CITATION LIST

Patent Literature

Patent Literature 1: Japanese Unexamined Patent Publication No. 2005-033037

SUMMARY OF INVENTION

An optical transmitter according to one aspect includes: a plurality of light emitting elements; a plurality of light receiving elements that monitor output lights from the respective plurality of light emitting elements; a housing that mounts the plurality of light emitting elements and the plurality of light receiving elements; and a wiring board which is mounted on the housing and which is provided with a first region having a first pad electrically connected to the light emitting element and a second region disposed at a position lower than the first region and having a second pad electrically connected to the light receiving element.

DESCRIPTION OF EMBODIMENTS

Figure 1:
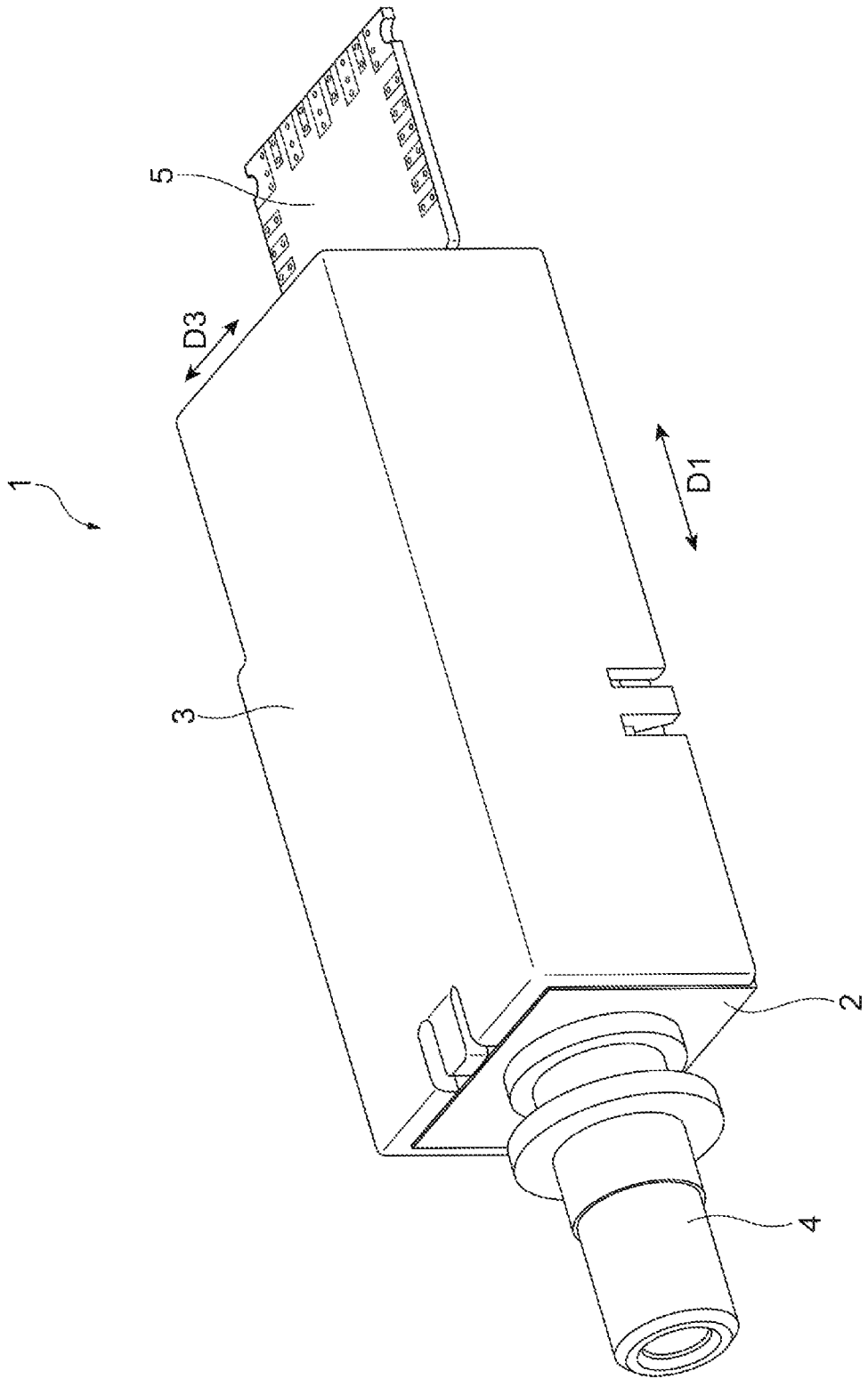
FIG. 1 is a perspective view illustrating an optical transmitter according to an embodiment.

In some cases, unlike the above-mentioned hermetic type storage body, an optical transmitter provided with a non-hermetic type (non-airtight) storage body may be used for cost reduction. The optical transmitter includes an LD (Laser Diode), a carrier that mounts the LD, an FPC (Flexible Printed Circuit) that has a pad electrically connected to the LD, and a monitor PD (Photo Diode) that monitors light from the LD.

The LD is electrically connected to a wiring pattern of the FPC, and the monitor PD is electrically connected to a wiring pattern on the carrier. There is known an optical transmitter that mounts an optical component such as an LD on a metal base without using the above-mentioned carrier. In the case of this optical transmitter, it is not possible to provide the wiring pattern on the metal base. For this reason, it is considered that the carrier is provided with the wiring pattern on the base. However, there is a possibility that such a configuration where the carrier is further disposed on the base may cause an increase in cost.

An object of the present disclosure is to provide an optical transmitter that can require no disposition of a carrier provided with a wiring pattern.

According to the present disclosure, it is possible to require no disposition of a carrier provided with a wiring pattern.

The details of the embodiments of the present disclosure will be listed and described. An optical transmitter according to one embodiment includes: a plurality of light emitting elements; a plurality of light receiving elements that monitor output lights from the respective plurality of light emitting elements; a housing that mounts the plurality of light emitting elements and the plurality of light receiving elements; and a wiring board which is mounted on the housing and which is provided with a first region having a first pad electrically connected to the light emitting element and a second region disposed at a position lower than the first region and having a second pad electrically connected to the light receiving element.

In the optical transmitter, the wiring board is mounted on the housing that mounts the plurality of light emitting elements and the plurality of light receiving elements. The wiring board has a first region having a first pad electrically connected to each of the plurality of light emitting elements and a second region having a second pad electrically connected to each of the plurality of light receiving elements. Since the second pad electrically connected to the light receiving element and the first pad electrically connected to the light emitting element are both provided on the wiring board, electrical wiring can be provided on the housing. Even when the housing is made of a metal, since the electrical wiring can be provided on the wiring board extending from the housing, no disposition of such as a carrier provided with a wiring pattern can be required. As a result, the increase in cost can be suppressed. The second pad, which is electrically connected to the light receiving element, is disposed at a position lower than the first pad, which is electrically connected to the light emitting element. Therefore, since the wiring extending from the light receiving element to the second pad can be unlikely to overlap the output light, the wiring does not interfere with the optical path of the output light. As a result, the output light can be monitored more reliably in the light receiving element.

The plurality of light emitting elements may be disposed to be aligned along a first direction, and the plurality of light receiving elements may be disposed to be aligned along the first direction. The wiring board may have a connection region connecting the first region and the second region to each other. A width of the first direction of the connection region may be smaller than the width of the first direction of the first region and the width of the first direction of the second region, respectively. In this case, since the width of the connection region connecting the first region and the second region to each other is small, it is possible to suppress an increase in the area of the wiring board. Therefore, components can be disposed compactly.

The connection region may extend from an end portion of the first direction of the first region to an end portion of the first direction of the second region. In this case, the width of the first direction of the connection region can be further small.

A thickness of the wiring board in the first region and a thickness of the wiring board in the second region are the same as each other, and the connection region may have a step difference or an inclination. In this case, since the thickness of the wiring board in the first region is the same as the thickness of the wiring board in the second region, the configuration of the wiring board can be simplified.

The optical transmitter described above may further include a spacer provided between the first region of the wiring board and the housing. In this case, the spacer intervenes between the first region and the housing of the wiring board, which is higher than the second region. Therefore, the spacer can retain the first region in a more stable state.

The optical transmitter described above may further include a cover that covers housing, and the housing may have a guide pin that determines a position of the cover relative to the housing. The wiring board may have an extension region that is on an extension line of the connection region and extends from the second region along a second direction that intersects the first direction, and a hole into which the guide pin is inserted may be formed in the extension region. In this case, the extension region extending from the connection region of the wiring board can be effectively used as the region where the hole into which the guiding guide pin of the housing is inserted is formed.

The second pad in the second region of the wiring board may be provided at a position deviated from an optical axis of the output light from the light emitting element. In this case, the possibility that the wiring extending from the second pad interferes with the output light can be further reduced.

The second pad may be provided on an outer side of the first direction of the housing of the optical axis in the second region of the wiring board. In this case, by providing the second pad on the outer side of the first direction, the interference of the wiring extending from the second pad to the light receiving element with the output light can be more reliably suppressed.

The optical transmitter described above may further include a wave combiner that wave-combines the output lights from each of the plurality of light emitting elements, and a receptacle that is disposed on the light output side of the housing as viewed from the wave combiner. An optical axis of light passing through the receptacle may be the same as an optical axis of light wave-combined by the wave combine, and may be located on an end portion side of the center of the first direction of the housing. The connection region may be located on the end portion side and the same side as the receptacles from the center of the first direction of the housing. In this case, the position of the first direction of the connection region can be located on the same side as the receptacles.

The light receiving element may a surface-incident type light receiving element, a mounting surface of the carrier that mounts the light receiving element may be inclined, and a light receiving surface of the light receiving element may be disposed so as to be inclined with respect to the optical axis of the output light. The second region may be located on the opposite side of the light emitting element as viewed from the carrier. In this case, by disposing the light receiving surface so as to be inclined with respect to the optical axis, it is possible to monitor a portion of the output light with higher accuracy in the surface-incident type light receiving element.

Specific examples of the optical transmitter of the present disclosure will be described below with reference to the drawings. It is noted that the present invention is not limited to the following examples, but is indicated by the scope of the claims and is intended to include all modified examples within the scope of the claims and equivalents thereof. In the description of the drawings, the same or corresponding elements are denoted by the same reference numerals, and duplicate description will be omitted as appropriate. The drawings may be partially simplified or exaggerated for ease of understanding, and the dimensional ratios and the like are not limited to those described in the drawings.

FIG. 1 is a perspective view illustrating an optical transmitter 1 according to the present embodiment. As illustrated in FIG. 1, the optical transmitter 1 includes a housing 2, a cover 3 that covers the housing 2, a receptacle 4 having a cylindrical sleeve, and a wiring board 5. The optical transmitter 1 extends along a longitudinal direction D1, and the receptacle 4, the cover 3 (housing 2), and the wiring board 5 are arranged in this order.

Figure 2:
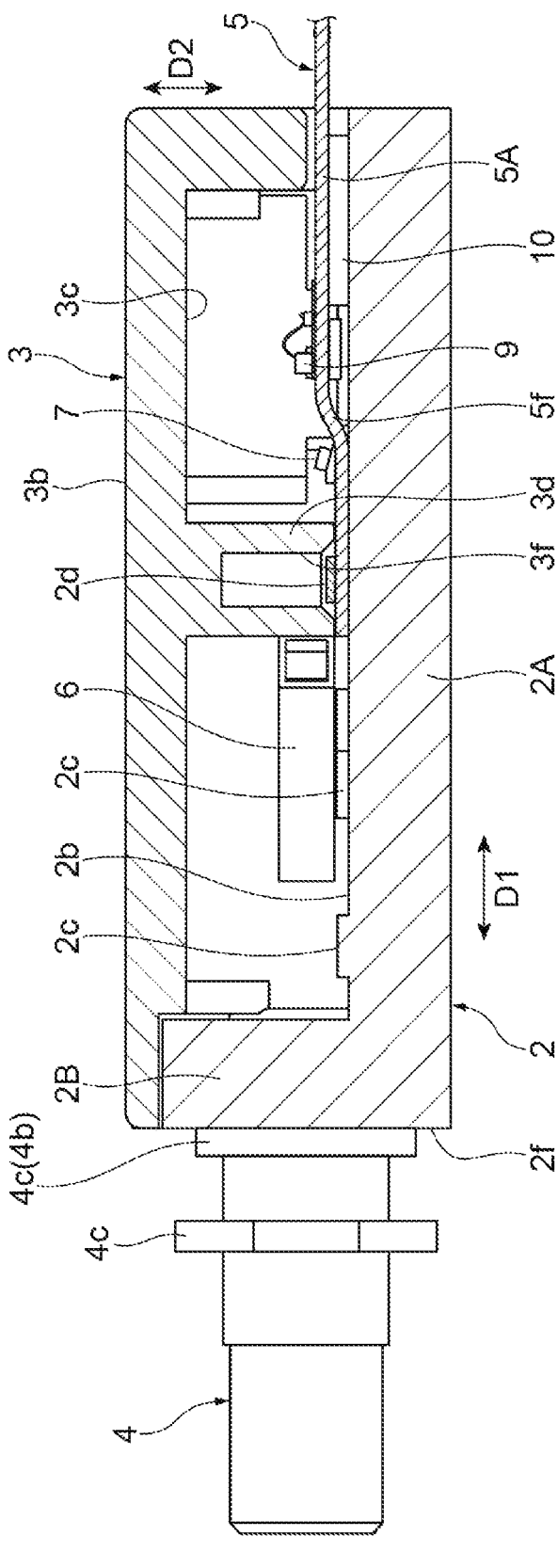
FIG. 2 is a vertical sectional view of the optical transmitter of FIG. 1.

FIG. 2 is a partial cross-sectional view of the optical transmitter 1. As illustrated in FIGS. 1 and 2, the housing 2 includes a lower board 2A extending in the longitudinal direction D1 and a side wall 2B extending from one end of the longitudinal direction D1 of the lower board 2A in a height direction D2. The housing 2 is made of, for example, a metal. The material of the housing 2 is, for example, Kovar (an alloy in which at least nickel and cobalt are mixed with iron) or SUS (Stainless Used Steel). The housing 2 may be made of iron, chromium, an alloy of iron and chromium, an alloy of iron and nickel, or plastic.

The shape of the housing 2 viewed from a width direction D3 of the optical transmitter 1 is L-shaped. The housing 2 is also referred to as an L-shaped base. The receptacle 4 is inserted into the side wall 2B, a hole which is an emission end of output light L (refer to FIG. 3) is formed, and the hole penetrates through the side wall 2B in the longitudinal direction D1. The receptacle 4 is formed in a cylindrical shape. The receptacle 4 has a plurality of flanges 4c, and one of the plurality of flanges 4c functions as a guide 4b that determines a position of the receptacle 4. In the receptacle 4, for example, the guide 4b comes into contact with an outer surface 2f of the side wall 2B in a state of being fixed to the housing 2.

As viewed from the height direction D2, for example, the housing 2 has a rectangular shape. The housing 2 is a component that mounts a component accommodated inside the optical transmitter 1, and each component of the optical transmitter 1 is mounted on the lower board 2A. The lower board 2A is an elongated portion protruding from the side wall 2B in the longitudinal direction D1, and each component of the optical transmitter 1 is mounted on the elongated portion. The lower board 2A has a main surface 2b that faces each component inside the optical transmitter 1, a convex mounting surface 2c that mounts the component, a guide pin 2d that determines a position of the cover 3 with respect to housing 2, and the outer surface 2f that is exposed to the outside of the optical transmitter 1.

The main surface 2b has a rectangular shape extending in the longitudinal direction D1 and the width direction D3. The mounting surface 2c is a portion of the main surface 2b that protrudes in the height direction D2. For example, each component such as a wave combiner 6 that performs wave combining of light is mounted on the mounting surface 2c. The guide pin 2d protrudes in the height direction D2 on the main surface 2b. The guide pin 2d is, for example, cylindrical. The guide pin 2d is provided, for example, on one side of the width direction D3 (a position deviated from the center of the width direction D3 of the housing 2).

The cover 3 is a component that covers the housing 2 from the height direction D2, and each component of the optical transmitter 1 is accommodated inside the housing 2 and the cover 3. The cover 3 has an outer surface 3b exposed to the outside of the optical transmitter 1 and an inner surface 3c facing each component of the optical transmitter 1. The inner surface 3c has a convex portion 3d protruding toward the guide pin 2d of the housing 2 and a hole portion 3f which is formed inside the convex portion 3d and into which the guide pin 2d is fit in the height direction D2. The cover 3 is fixed to the housing 2 by fitting the guide pin 2d into the hole portion 3f.

Figure 3:
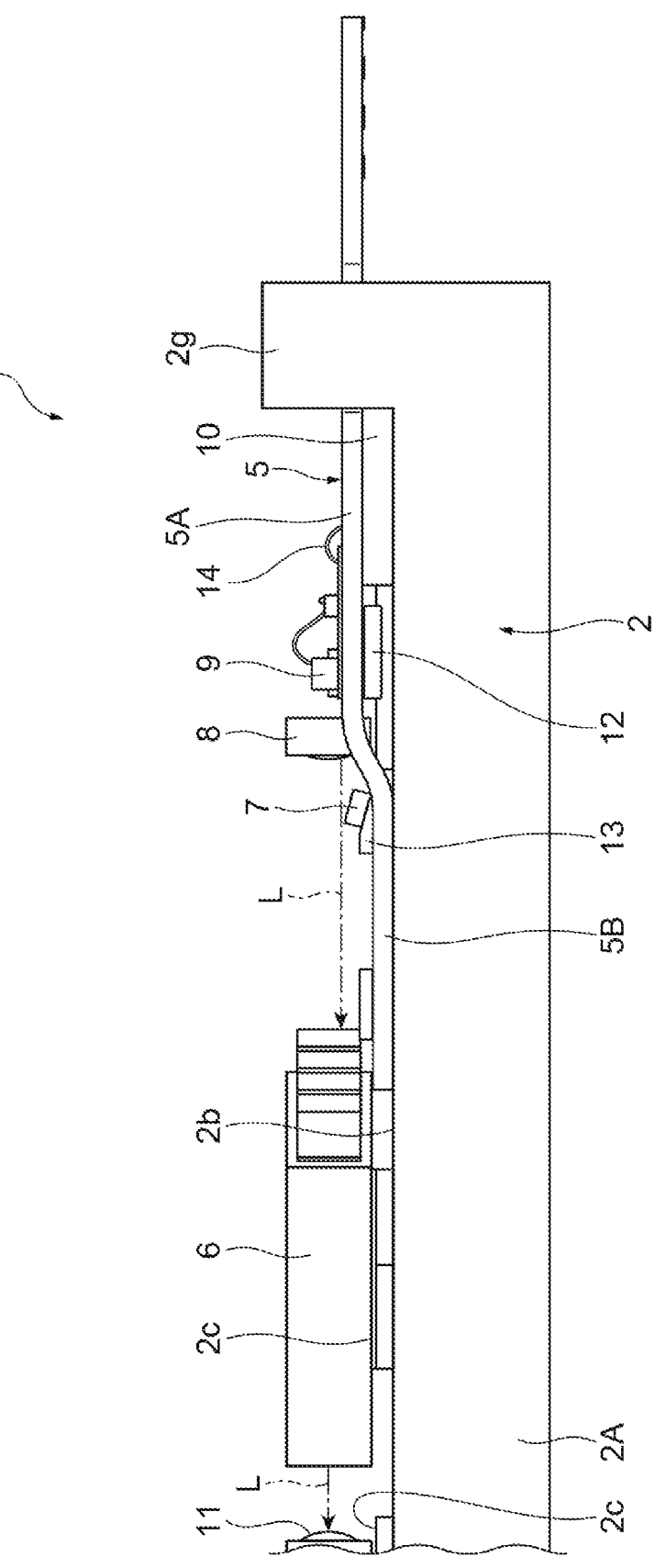
FIG. 3 is a cross-sectional view illustrating a state in which a cover is removed from the optical transmitter of FIG. 1.

FIG. 3 is a side view of the housing 2 illustrating a state in which the cover 3 is removed from optical transmitter 1. As illustrated in FIGS. 2 and 3, the optical transmitter 1 includes the wiring board 5, the wave combiner 6, a light receiving element 7, a first lens 8, a light emitting element 9, and a spacer 10 inside the housing 2 and the cover 3. A portion of the wiring board 5 extends from the housing 2 and the cover 3 to the opposite side of receptacle 4. The portion of the wiring board 5 extending to the opposite side with the receptacle 4 protrudes to the outside of the optical transmitter 1.

Figure 4:
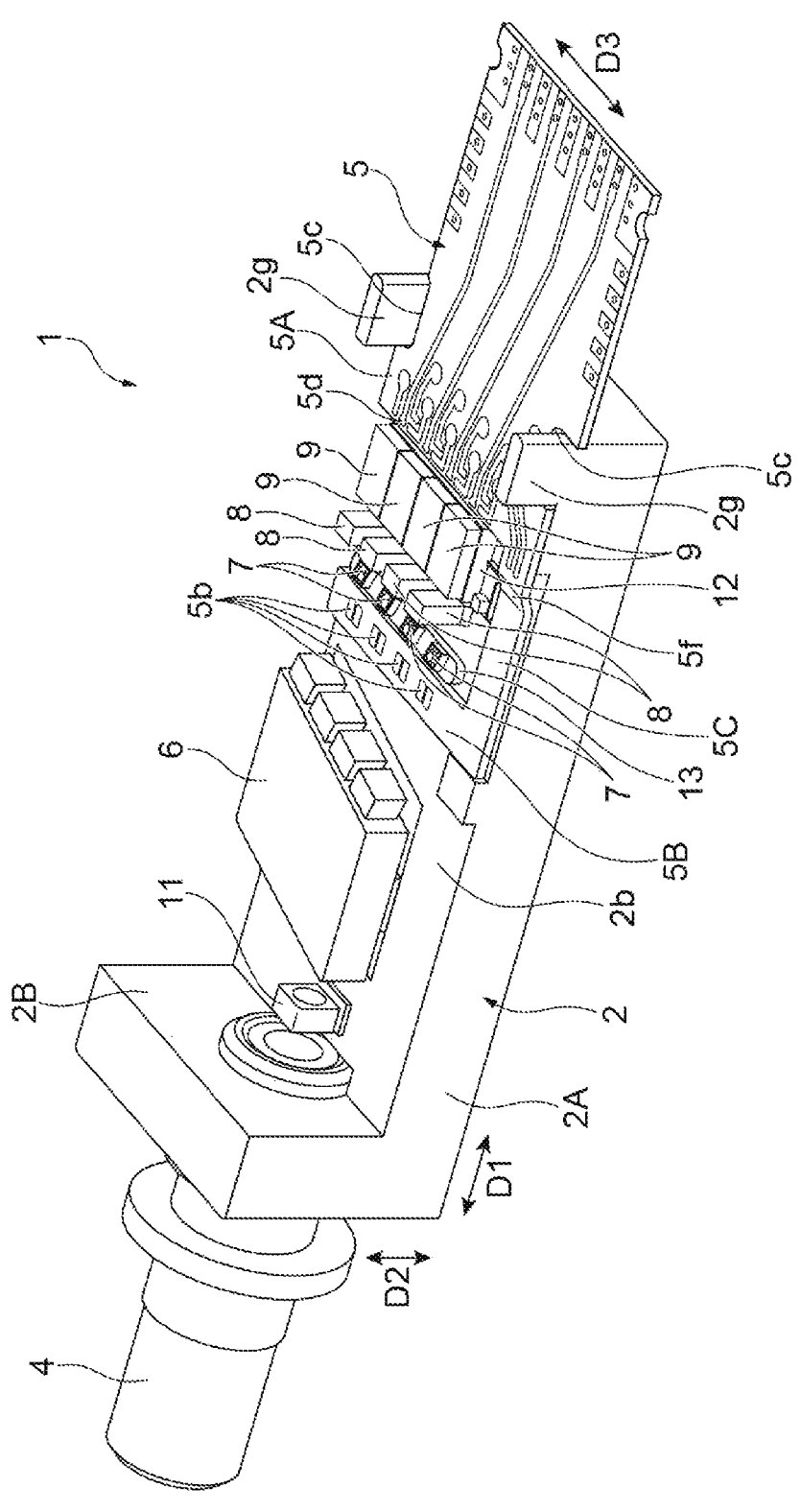
FIG. 4 is a perspective view illustrating the state in which the cover is removed from the optical transmitter of FIG. 1.

FIG. 4 is a perspective view illustrating the receptacle 4, the housing 2, and the components of the optical transmitter 1 mounted on the main surface 2b of the housing 2. As illustrated in FIGS. 3 and 4, the optical transmitter 1 further includes a second lens 11 intervening between the receptacle 4 and the wave combiner 6. For example, the optical transmitter 1 includes four light emitting elements 9, four first lenses 8, four light receiving elements 7, the wave combiner 6, and the second lens 11.

The optical transmitter 1 is a four-lane multi-channel light emitting module including four light receiving elements 7, four first lenses 8, and four light receiving elements 7. As described above, in the optical transmitter 1 provided with the optical paths of the output light L of four lanes, the optical path lengths of the output light L are different from each other for each channel. The receptacle 4 is disposed, for example, at a position deviated from the center of the width direction D3 of the housing 2. The optical path of the output light L from the light emitting element 9 located at the end portion of the opposite side with the receptacle 4 of the width direction D3 (the end portion of the upper side in FIG. 4) is the longest. The optical path of the output light L from the light emitting element 9 located at the end portion on the receptacle 4 side of the width direction D3 (the end portion of the lower side in FIG. 4) is the shortest.

A plurality of the light emitting elements 9 and a plurality of the light receiving elements 7 are mounted on the housing 2. The plurality of light emitting elements 9 are disposed so as to be aligned along the width direction D3 (first direction), and the plurality of light receiving elements 7 are disposed so as to be aligned along the width direction D3. For example, each of the four light emitting elements 9 is mounted on the main surface 2b of the housing 2 via a carrier 12 (first mounting portion). Each light emitting element 9 is provided corresponding to each of the four first lenses 8 and each of the four light receiving elements 7. Each light emitting element 9 is, for example, a semiconductor laser diode (LD). The output light L, which is a divergent light output from the light emitting element 9, is converted into collimated light by each first lens 8.

A portion of the output light L output from the light emitting element 9 via the first lens 8 is input to the wave combiner 6 through the light receiving element 7. The wave combiner 6 is, for example, an optical wave combiner that wave-combines four output lights L. The four output lights L are wave-combined inside the wave combiner 6 and output from the wave combiner 6 to the second lens 11 as one output light L. The second lens 11 condenses the output light L from the wave combiner 6 and condenses the output light L on the optical fiber retained in the receptacle 4, and the output light L is output to the outside of the optical transmitter 1 via the optical fiber retained in the receptacle 4.

The light receiving element 7 is a monitor PD (Photo Diode) that monitors the output light L from each of the plurality of light emitting elements 9. The light receiving element 7 monitors the intensity of output light L by receiving a portion of the output light L from the light emitting element 9. For example, each of the four light receiving elements 7 is mounted on the main surface 2b of the housing 2 via a carrier 13 (second mounting portion) made of a material containing a dielectric material or a protrusion provided in the housing 2.

The light receiving element 7 converts a portion of the output light L from the light emitting element 9 into an electric signal and outputs the converted electric signal to a pad 5b (second pad) of the wiring board 5 via a wire (not illustrated). The wire extending from the light receiving element 7 and the light receiving element 7 is provided on the light output side (receptacle 4 side) of the light emitting element 9. By the output of the electric signal from the light receiving element 7, APC control (Auto Power Control) can be executed for the output light L from the light emitting element 9.

The wiring board 5 is, for example, an FPC (Flexible Printed Circuit) mounted on the housing 2. The housing 2 is provided with a pair of protruding portions 2g protruding upward at the end portion of the opposite side with the side wall 2B of the longitudinal direction D1. The pair of protruding portions 2g are disposed so as to be aligned along the width direction D3. The wiring board 5 includes a first region 5A extending to the outside of the optical transmitter 1, a second region 5B provided with the pad 5b, and a connection region 5C connecting the first region 5A and the second region 5B to each other. As viewed from the height direction D2, the first region 5A, the second region 5B, and the connection region 5C have a U-shape (C-shape).

The first region 5A has a concave portion 5c at both ends of the width direction D3. The first region 5A has a pair of concave portions 5c aligned in the width direction D3, and the wiring board 5 is fixed to the housing 2 by fitting each protruding portion 2g of the housing 2 into each concave portion 5c. The first region 5A includes a pad 5d (first pad) that is electrically connected to the light emitting element 9. For example, each of the plurality of light emitting elements 9 is electrically connected to the pad 5d via a wire 14. The first region 5A is provided at a position higher than the second region 5B (a position separated from the main surface 2b of the housing 2), and for example, the height of the first region 5A coincides with the height of the carrier 12 that mounts the light emitting element 9. Accordingly, it is possible to shorten the length of the wire 14 extending from each light emitting element 9.

For example, one wiring board 5 has the first region 5A as an upper stage and the second region 5B as a lower stage and is fixed to the housing 2 by adhesion. The second region 5B is provided at a position lower than the first region 5A and is in contact with, for example, the main surface 2b of the housing 2. Due to the low position of the second region 5B, the wire extending from the wiring board 5 or the light receiving element 7 can be prevented from interfering with the output light L passing through the light emitting element 9 and the first lens 8.

Figure 5:
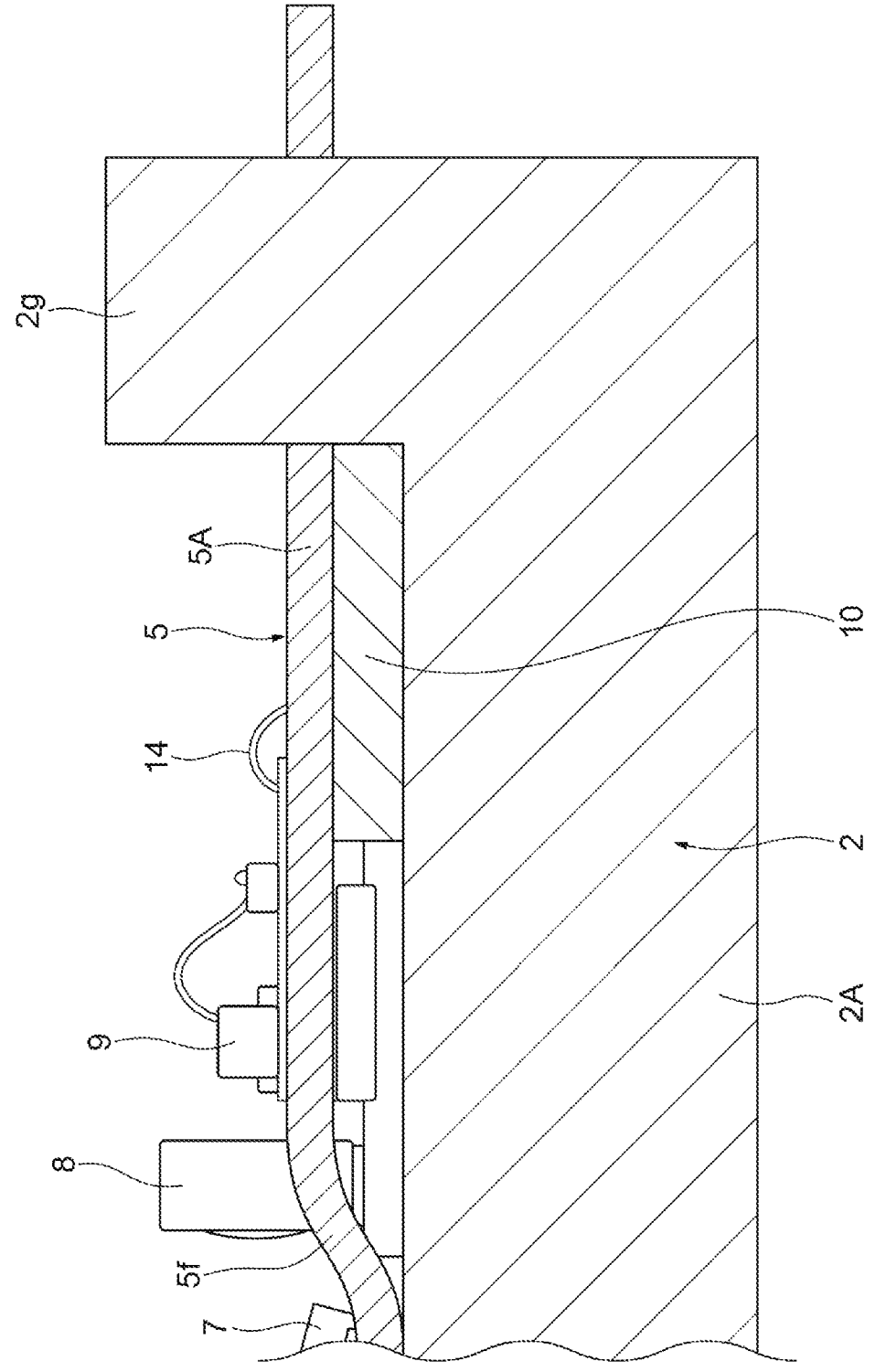
FIG. 5 is a cross-sectional view illustrating a housing, a wiring board, a light emitting element, and a spacer of the optical transmitter of FIG. 1.

FIG. 5 is a vertical sectional view of the housing 2 in which the spacer 10 is enlarged. As illustrated in FIG. 5, the spacer 10 is provided between the first region 5A and the housing 2, and for example, the height of the first region 5A is secured by the spacer 10. Instead of the spacer 10, a reinforcing plate made of an insulating material may be provided to the first region 5A of the wiring board 5. In this case, it is possible to provide a wiring pattern on the lower surface of the first region 5A as well.

Figure 6:
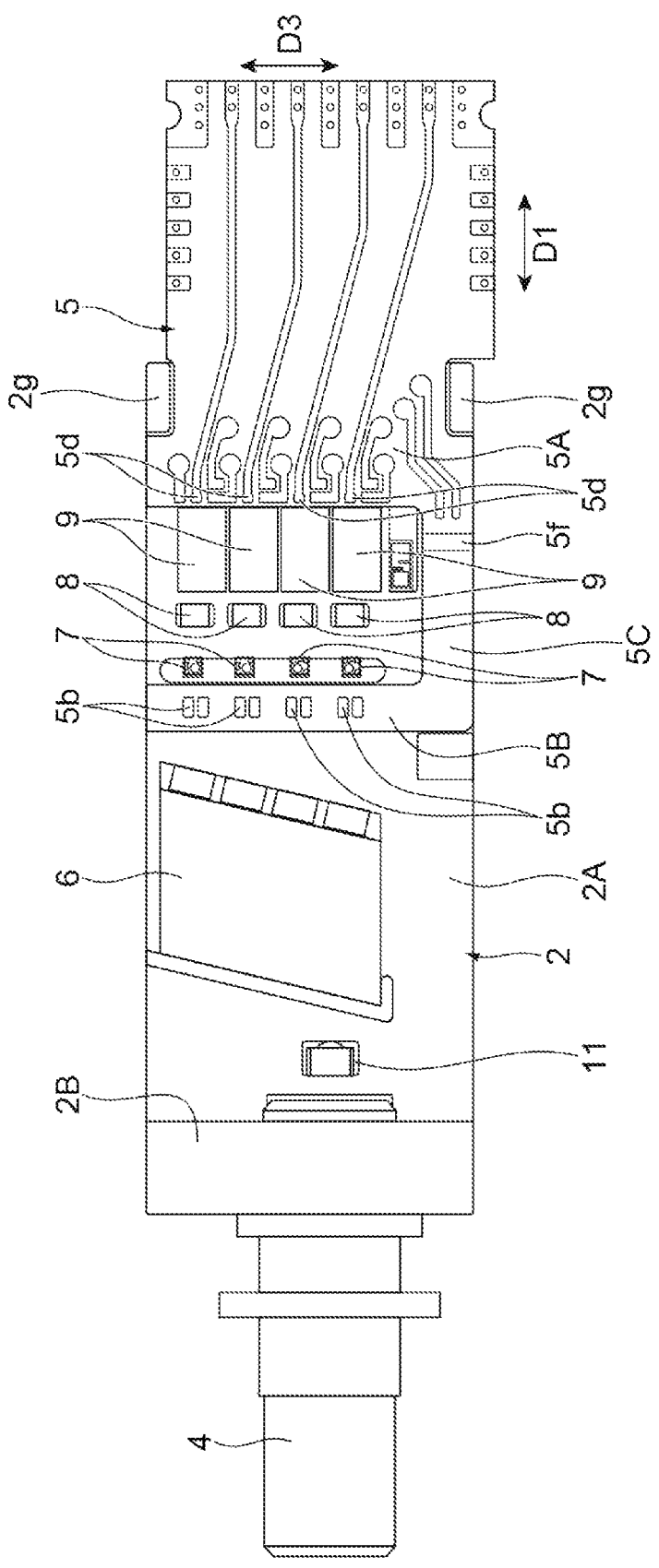
FIG. 6 is a plan view illustrating the state in which the cover is removed from the optical transmitter of FIG. 1.
Figure 7:
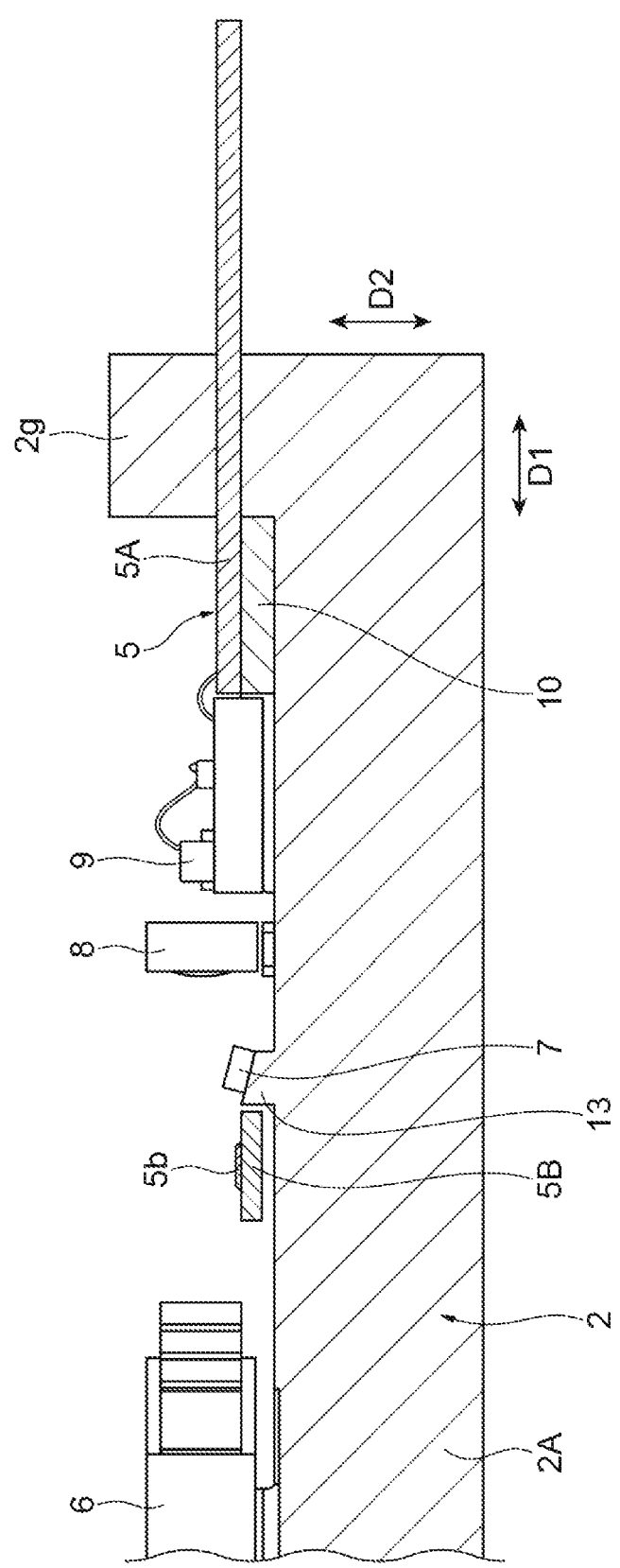
FIG. 7 is a cross-sectional view illustrating a housing, a wave combiner, a light receiving element, a light emitting element, a wiring board, and a spacer of the optical transmitter of FIG. 1.

FIG. 6 is a plan view illustrating the housing 2, the receptacle 4, the wiring board 5, the wave combiner 6, the light receiving element 7, the first lens 8, the light emitting element 9, and the second lens 11. FIG. 7 is a vertical cross-sectional view illustrating the housing 2, the wiring board 5, the wave combiner 6, the light receiving element 7, the first lens 8, and the light emitting element 9. As illustrated in FIGS. 6 and 7, the width of the connection region 5C of the wiring board 5 (the length of the width direction D3) is smaller than the width of the first region 5A and the width of the second region 5B, respectively.

The connection region 5C is provided, for example, in the end portion of the width direction D3 on the receptacle 4 side (lower side in FIG. 6). The connection region 5C extends from the end portion of the width direction D3 of the first region 5A to the end portion of the width direction D3 of the second region 5B. As a result, the receptacle 4 can be disposed at a side inner than the end portion of the width direction D3 instead of the end portion of the width direction D3. The thickness of the wiring board 5 in the first region 5A and the thickness of the wiring board 5 in the second region 5B are, for example, the same as each other. The connection region 5C extends in the longitudinal direction D1 between the first region 5A and the second region 5B, and is located, for example, in the end portion of the width direction D3 of the housing 2. The connection region 5C has a step difference or an inclination located between the first region 5A and the second region 5B. In this embodiment, an example in which the connection region 5C has an inclination 5f is illustrated.

Figure 8:
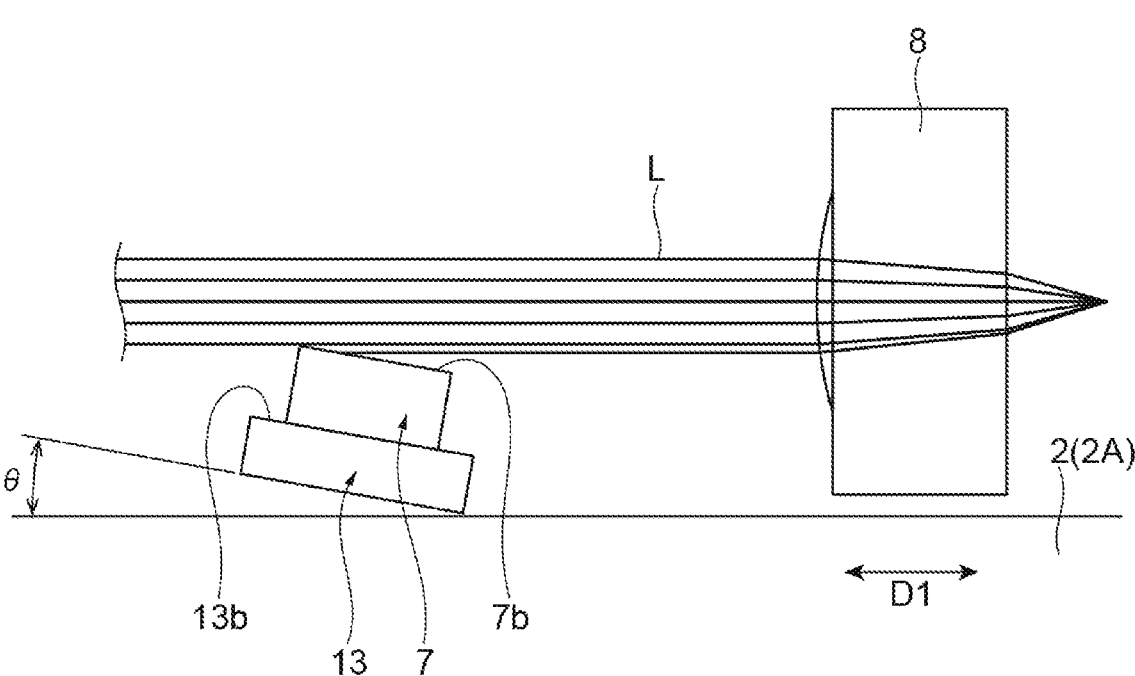
FIG. 8 is a diagram schematically illustrating a positional relationship between the output light from the light emitting element of FIG. 7 and the light receiving element.

FIG. 8 is a side view schematically illustrating the light receiving element 7, the first lens 8, and the carrier 13. As illustrated in FIGS. 7 and 8, the second region 5B is a PD wiring FPC having the pad 5b for being wired to the light receiving element 7 and is located on the light output side (receptacle 4 side) of the light receiving element 7. The carrier 13 described above has a mounting surface 13b that mounts the light receiving element 7. The mounting surface 13b is disposed so as to be inclined with respect to the optical axis of the output light L from the light emitting element 9 (the optical axis extending from the light emitting element 9 along the longitudinal direction D1).

The light receiving element 7 is a surface-incident type light receiving element and has a light receiving surface 7b on the surface. Since the mounting surface 13b is disposed so as to be inclined with respect to the optical axis of the output light L, the light receiving surface 7b of the light receiving element 7 is also disposed so as to be inclined with respect to the optical axis of the output light L. By disposing the light receiving element 7 so that the light receiving surface 7b forms an inclination angle θ with respect to the optical axis of the output light L, the light receiving element 7 receives a portion of the output light L.

By disposing the light receiving element 7 on the light output side of the light emitting element 9, it is possible to monitor the output light L on the light output side with a simple configuration. Wiring such as a wire for the light receiving element 7 which is a monitor PD is provided on the light output side of the light receiving element 7. Therefore, it is possible to electrically connect the light receiving element 7 to the light receiving element 7 without lowering the light receiving sensitivity. Since the light receiving element 7 is directly wired to the pad 5b on the wiring board 5, for example, it is not necessary to separately mount the carrier or the like. Therefore, this configuration contributes to cost reduction.

The function and effect obtained from the optical transmitter 1 according to the present embodiment will be described in detail. In the optical transmitter 1, the wiring board 5 is mounted on the housing 2 that mounts a plurality of the light emitting elements 9 and a plurality of the light receiving elements 7. The wiring board 5 has the first region 5A having the pad 5d electrically connected to each of the plurality of light emitting elements 9 and the second region 5B having the pad 5b electrically connected to each of the plurality of light receiving elements 7. Therefore, since the pad 5b electrically connected to the light receiving element 7 and the pad 5d electrically connected to the light emitting element 9 are both provided on one wiring board 5, the electrical wiring can be provided on the housing 2.

Even when the housing 2 is made of a metal, since the electrical wiring can be provided on the wiring board 5 extending from the housing 2, no disposition of such as a carrier provided with a wiring pattern can be required. As a result, the increase in cost can be suppressed. The pad 5b electrically connected to the light receiving element 7 is disposed at a position lower than the pad 5d electrically connected to the light emitting element 9. Therefore, since the wiring such as the wire extending from the light receiving element 7 to the pad 5b can be unlikely to overlap the output light L, the wiring does not interfere with the optical path of the output light L. As a result, the output light L can be monitored more reliably in the light receiving element 7.

The plurality of light emitting elements 9 may be disposed so as to be aligned along the width direction D3, and the plurality of light receiving elements 7 may be disposed so as to be aligned along the width direction D3. The wiring board 5 may have the connection region 5C that connects the first region 5A and the second region 5B to each other. The width of the connection region 5C (the length of the width direction D3) may be smaller than the width of the first region 5A and the width of the second region 5B, respectively. In this case, since the width of the connection region 5C connecting the first region 5A and the second region 5B to each other is small, it is possible to suppress an increase in the area of the wiring board 5. Therefore, components can be disposed compactly.

The connection region 5C may extend from the end portion of the width direction D3 of the first region 5A to the end portion of the width direction D3 of the second region 5B. In this case, the width of the width direction D3 of the connection region 5C can be further small.

The thickness of the wiring board 5 in the first region 5A and the thickness of the wiring board 5 in the second region 5B may be the same as each other. The connection region 5C may have a step difference or the inclination 5f. In this case, since the thickness of the first region 5A is the same as the thickness of the wiring board 5 in the second region 5B, the configuration of the wiring board 5 can be simplified.

The optical transmitter 1 may further include the spacer 10 provided between the first region 5A of the wiring board 5 and the housing 2. In this case, the spacer 10 is interposed between the first region 5A of the wiring board 5, which is higher than the second region 5B, and the housing 2. Therefore, the spacer 10 can retain the first region 5A in a more stable state.

The optical transmitter 1 may further include the wave combiner 6 that wave-combines the output light L from each of the plurality of light emitting elements 9 and the receptacle 4 that is disposed on the light output side of the housing 2 as viewed from the wave combiner 6. The optical axis of the light passing through the receptacle 4 may be the same as the optical axis of the light combined by the wave combiner 6 and may be located on the end portion side from the center of the width direction D3 of the housing 2. The connection region 5C may be located on the end portion side from the center of the width direction D3 of the housing 2 and the same side as the receptacle 4. In this case, the position of the width direction D3 of the connection region 5C can be disposed so as to be biased to the same side as the receptacle 4.

The light receiving element 7 is a surface-incident type light receiving element, and the mounting surface 13b of the carrier 13 that mounts the light receiving element 7 may be inclination. The light receiving surface 7b of the light receiving element 7 may be disposed so as to be inclined with respect to the optical axis of the output light L, and the second region 5B may be disposed on the opposite side of the light emitting element 9 as viewed from the carrier 13. In this case, since the light receiving surface 7b is disposed so as to be inclined with respect to the optical axis of the output light L, a portion of the output light L can be monitored with higher accuracy in the surface-incident type light receiving element 7.

The housing 2 may be manufactured by MIM (Metal Injection Molding). In this case, the cost for manufacturing the housing 2 can be suppressed. In the housing 2, since the side wall 2B to which the receptacle 4 is mounted and the lower board 2A on which the component is mounted are integrated, the component tolerance can be likely to be reduced, and the housing 2 can be allowed to be highly rigid. The housing 2 is provided with the pair of protruding portions 2g protruding upward at the end portion of the opposite side with the side wall 2B of the longitudinal direction D1. Therefore, for example, even when the housing 2 with the mounted component is accidentally disposed upside down, since the side wall 2B and the protruding portion 2g hit the floor or the like, the mounted component can be prevented from interfering with the floor or the like.

Figure 9:
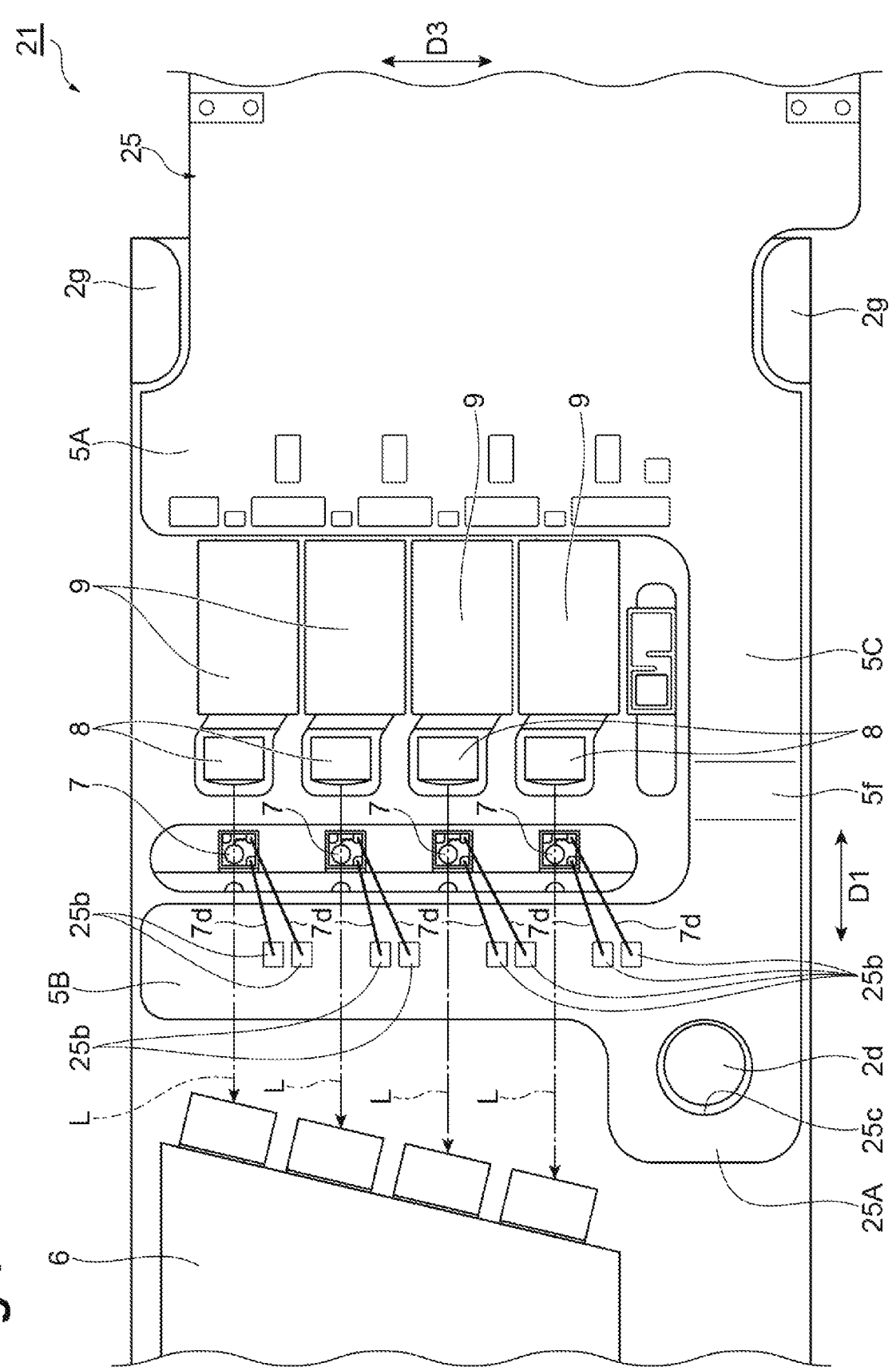
FIG. 9 is a plan view illustrating a housing, a wave combiner, a wiring board, a light receiving element, and a light emitting element of an optical transmitter according to Modified Example 1.
Figure 10:
FIG. 10 is a perspective view illustrating the housing, the wave combiner, the wiring board, the light receiving element, and the light emitting element of FIG. 9.
Figure 11:
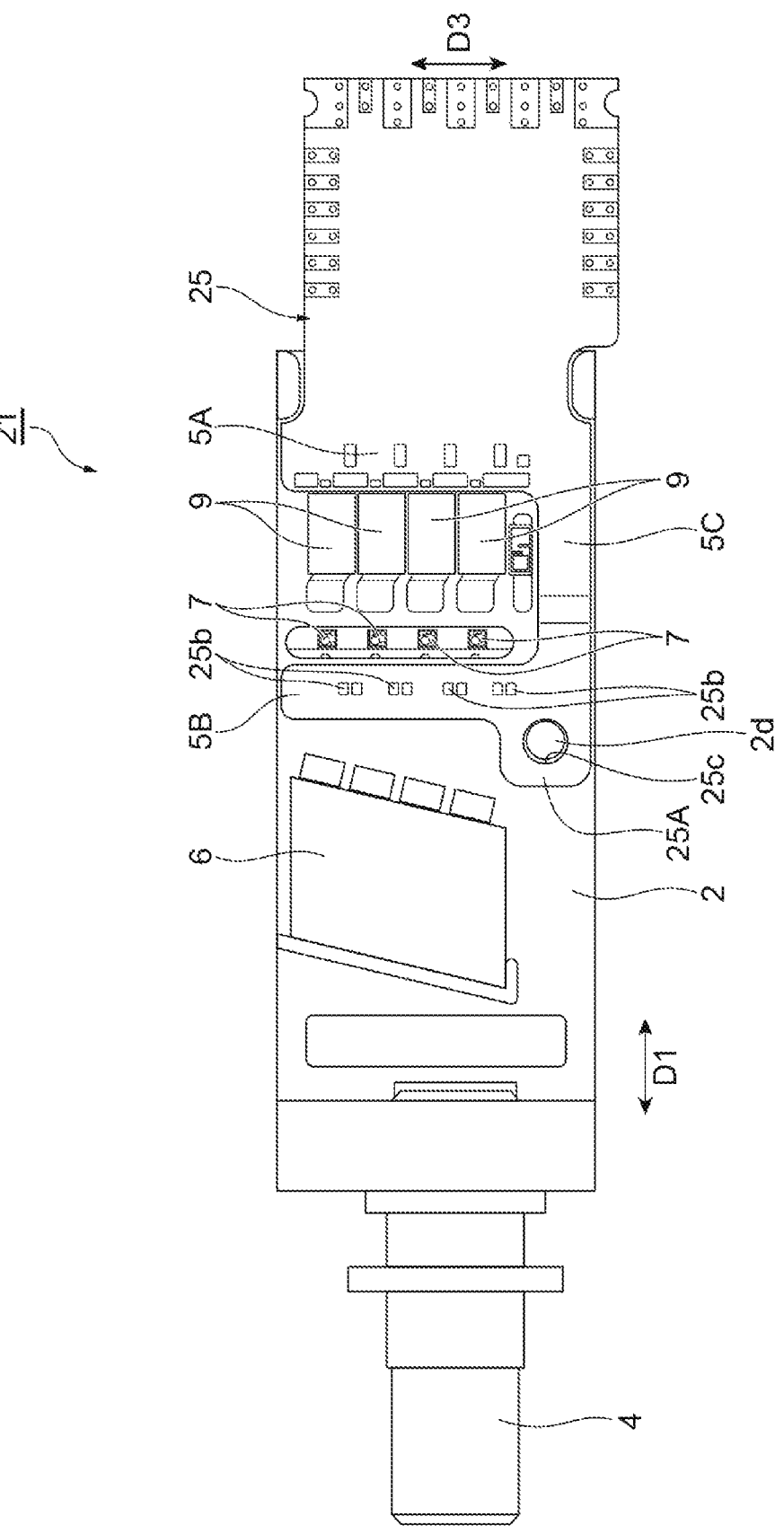
FIG. 11 is a plan view illustrating the housing, the wave combiner, the wiring board, the light receiving element, and the light emitting element of the optical transmitter according to Modified Example 1.

An optical transmitter 21 according to Modified Example 1 will be described with reference to FIGS. 9, 10, and 11. FIG. 9 is a plan view illustrating a wiring board 25 of the optical transmitter 21 according to Modified Example 1. FIG. 10 is a perspective view illustrating the housing 2, the receptacle 4, the wiring board 25, the wave combiner 6, the light receiving element 7, the light emitting element 9, and the spacer 10 of the optical transmitter 21. FIG. 11 is a plan view illustrating the housing 2, the receptacle 4, the wiring board 25, the wave combiner 6, the light receiving element 7, and the light emitting element 9 of the optical transmitter 21. Since the partial configuration of the optical transmitter 21 is the same as the partial configuration of the optical transmitter 1 described above, the description of the configuration of the optical transmitter 21 that overlaps the configuration of the optical transmitter 1 will be omitted as appropriate. The same components of the optical transmitter 21 as the optical transmitter 1 will be described with the same reference numerals.

The wiring board 25 has an extension region 25A extending from the connection region 5C in the longitudinal direction D1 in addition to the first region 5A, the second region 5B, and the connection region 5C described above. The extension region 25A protrudes, for example, from the second region 5B to the opposite side of the connection region 5C. A hole 25c into which the guide pin 2d of the housing 2 is inserted is formed in the extension region 25A, and the hole 25c penetrates in the height direction D2.

The wiring board 25 includes the first region 5A and the second region 5B as in the wiring board 5 described above. A pad 25b (second pad) to which a wire 7d from the light receiving element 7 is connected is provided in the second region 5B. For example, two wires 7d and two pads 25b are provided per one light receiving element 7. The two wires 7d and the two pads 25b are provided at positions away from the optical axis of the output light L. For example, the wires 7d and the pad 25b are provided at positions where the wires 7d and the pad 25b do not overlap the optical axis of the output light L as viewed from the height direction D2.

Like the optical transmitter 1, the optical transmitter 21 according to Modified Example 1 includes the cover 3 that covers the housing 2, and the housing 2 has the guide pin 2d that determines a position of the cover 3 with respect to the housing 2. The wiring board 25 has the extension region 25A that is on an extension line of the connection region 5C and extends along the longitudinal direction D1 (second direction) that intersects the width direction D3 from the second region 5B and the hole 25c into which the guide pin 2d is inserted is formed in the extension region 25A. Therefore, the extension region 25A extending from the connection region 5C of the wiring board 25 can be effectively used as the region into which the guide pin 2d of the housing 2 is inserted.

The pad 25b of the second region 5B of the wiring board 25 is provided at a position deviated from the optical axis of the output light L from the light emitting element 9. Therefore, the possibility that the wire 7d extending from the pad 25b interferes with the output light L can be further reduced.

Figure 12:
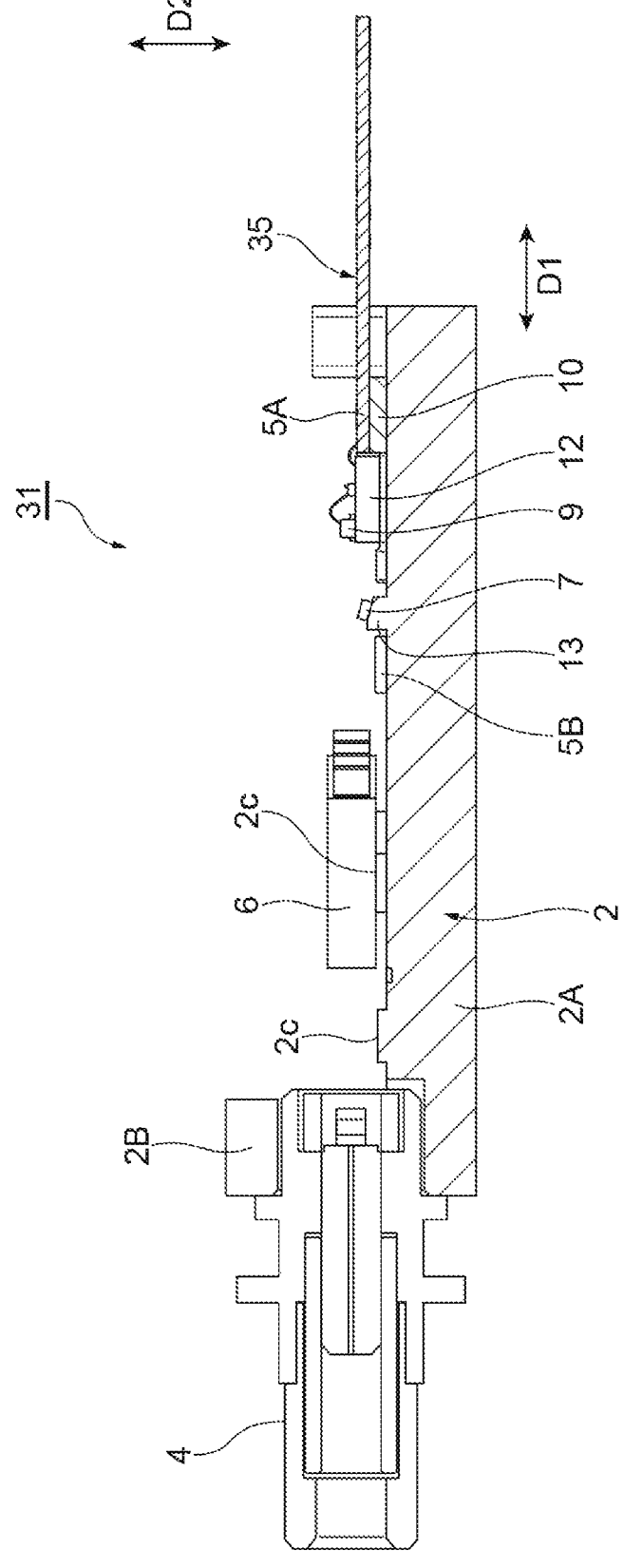
FIG. 12 is a cross-sectional view illustrating the housing, the wave combiner, the wiring board, the light receiving element, and the light emitting element of FIG. 11
Figure 13:
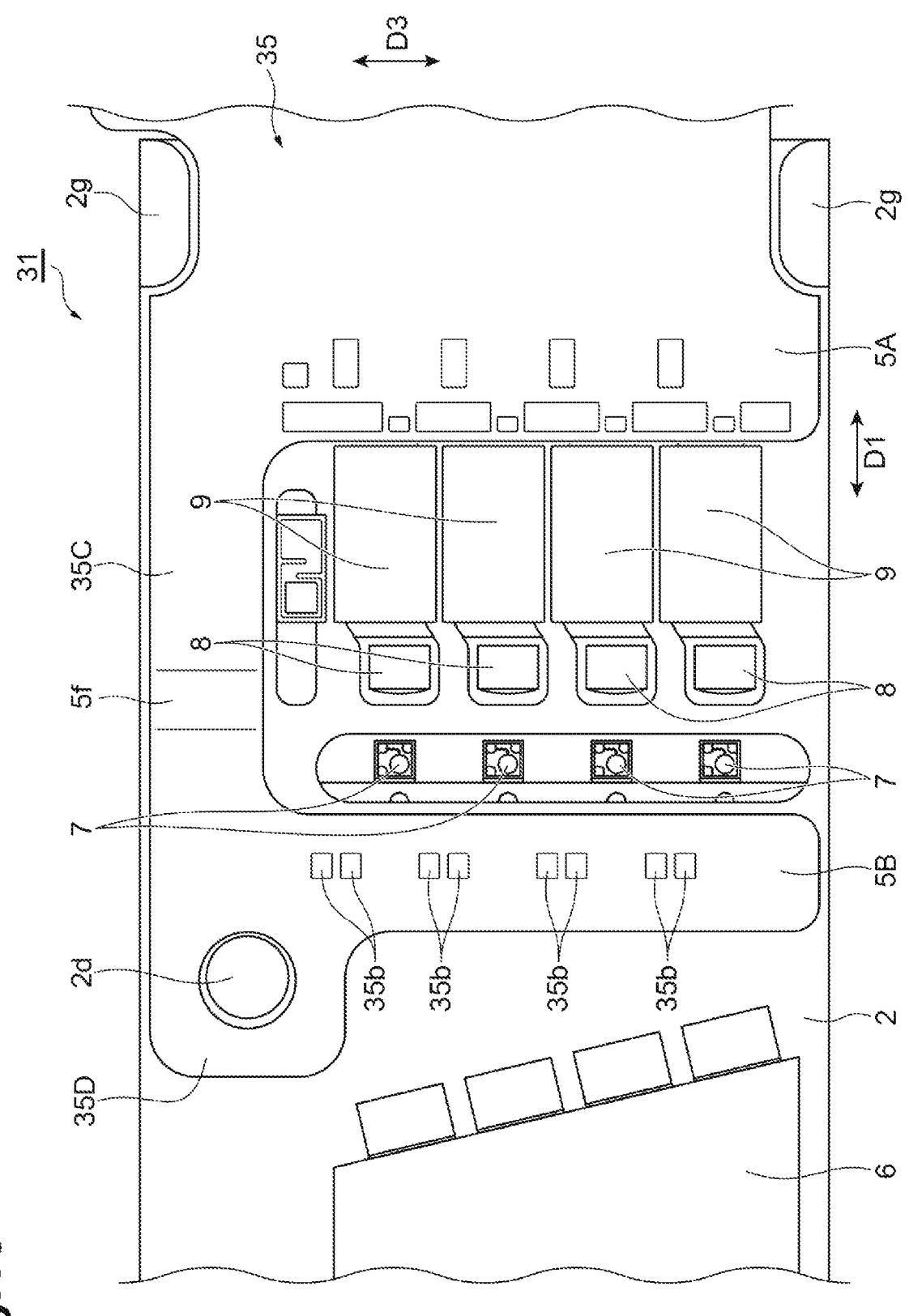
FIG. 13 is a plan view illustrating a housing, a wave combiner, a wiring board, a light receiving element, and a light emitting element of an optical transmitter according to Modified Example 2.
Figure 14:
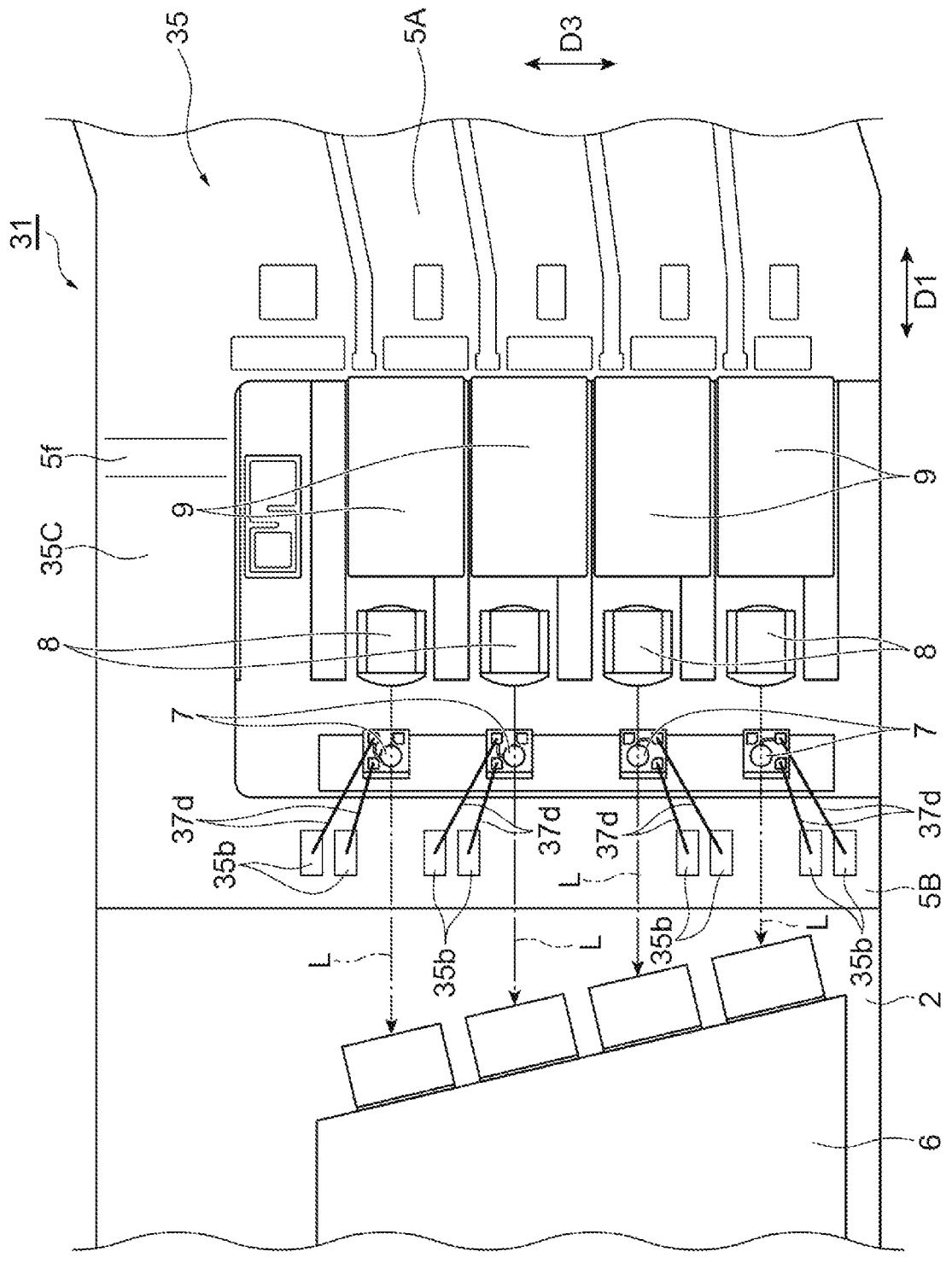
FIG. 14 is an enlarged plan view of a wiring board, a light receiving element, and a light emitting element according to a further modified example of Modified Example 2.

An optical transmitter 31 according to Modified Example 2 will be described with reference to FIGS. 12, 13, and 14. FIG. 12 is a vertical cross-sectional view of the housing 2 illustrating the receptacle 4, a wiring board 35, the wave combiner 6, the light receiving element 7, and the light emitting element 9 of the optical transmitter 31. FIG. 13 is a plan view illustrating the wiring board 35, the light receiving element 7, the first lens 8, and the light emitting element 9. FIG. 14 is a plan view illustrating still another modified example of Modified Example 2 of the wiring board 35 of FIG. 13

As illustrated in FIG. 13, in the optical transmitter 31 according to Modified Example 2, the shape of the wiring board 35 is different from that of the above-mentioned wiring board 5, and the aspect of a wire 37d extending from the light receiving element 7 is different from that of the above-mentioned example. Similarly to the wiring board 25 described above, the wiring board 35 includes the first region 5A, the second region 5B, and a connection region 35C. The wiring board 35 may further include an extension region 35D. As viewed from the height direction D2, the first region 5A, the second region 5B, and the connection region 35C are U-shaped.

However, the orientation of the U-shape formed by the first region 5A, the second region 5B, and the connection region 35C is opposite to the orientation of the U-shape formed by the first region 5A, the second region 5B, and the connection region 5C described above. That is, the position of the width direction D3 of the connection region 35C and the extension region 35D is different from the position of the width direction D3 of the connection region 5C and the extension region 25A. Along with this, in the optical transmitter 31, the deviation from the center of the width direction D3 in the receptacle is opposite to the deviation of the receptacle 4 described above. That is, the receptacle 4 of the optical transmitter 31 is biased from the center of the width direction D3 to the same side (upper side in FIGS. 13 and 14) as the connection region 35C and the extension region 35D.

As illustrated in FIG. 14, a pad 35b (second pad) to which the wire 37d from the light receiving element 7 is connected is provided in the second region 5B of the wiring board 35. Two wires 37d and two pads 35b are provided at positions away from the optical axis of the output light L. That is, similarly to the optical transmitter 21 described above, the wires 37d and pad 35b are provided at positions so as not to overlap the optical axis of the output light L as viewed from the height direction D2. The wire 37d extending from the light receiving element 7 extends from the center of the width direction D3 to the outside of the width direction D3 of the housing 2 so as to be inclined.

In the optical transmitter 31 according to Modified Example 2 and yet another modified example of Modified Example 2, the pad 35b is provided on the outer side of the width direction D3 of the optical axis of the output light L in the second region 5B of the wiring board 35. Therefore, by providing the pad 35b on the outer side of the width direction D3, the interference of the wire 37d extending from the pad 35b to the light receiving element 7 with the output light L can be more reliably suppressed.

The embodiment of the optical transmitter according to the present disclosure has been described above. However, the present invention is not limited to the above-described embodiment. That is, it is easily recognized by those skilled in the art that the present invention can be modified and changed in various ways without changing the spirit described in the claims. For example, the shape, size, number, material, and disposition mode of each component of the optical transmitter are not limited to those described above, and may be appropriately changed. For example, in the above description, the optical transmitter 1, the optical transmitter 21, and the optical transmitter 31 have been described as the optical transmitter according to the embodiment. However an optical transmitter in which some configurations of these optical transmitter 1, the optical transmitter 21, and the optical transmitter 31 are combined may be used.

REFERENCE SIGNS LIST 1, 21, 31: optical transmitter, 2: housing, 2A: lower board, 2B: side wall, 2b: main surface, 2c: mounting surface, 2d: guide pin, 2f: outer surface, 2g: protruding portion, 3: cover, 3b: outer surface, 3c: inner surface, 3d: convex portion, 3f: hole portion, 4: receptacle, 4b: guide, 4c: flange, 5, 25, 35: wiring board, 5A: first region, 5b, 25b, 35b: pad (second pad), 5B: second region, 5C, 35C: connection region, 5c: concave portion, 5d: pad (first pad), 5f: inclination, 6: wave combiner, 7: light receiving element, 7b: light receiving surface, 7d, 37d: wire, 8: first lens, 9: light emitting element, 10: spacer, 11: second lens, 12, 13: carrier, 13b: mounting surface, 14: wire, 25A, 35D: extension region, 25c: hole, D1: longitudinal direction (second direction), D2: height direction, D3: width direction (first direction), L: output light.

The invention claimed is:
1. An optical transmitter comprising:
a plurality of light emitting elements;
a plurality of light receiving elements that monitor output lights from the respective plurality of light emitting elements;
a housing that mounts the plurality of light emitting elements and the plurality of light receiving elements; and
a wiring board which is mounted on the housing and which is provided with a first region having a first pad electrically connected to the light emitting element, a second region having a second pad electrically connected to the light receiving element, and a connection region which connects the first region and the second region to each other,
wherein the plurality of light emitting elements and the plurality of light receiving elements are disposed so as to be aligned along a first direction intersecting the optical axis,
where the first region and the second region are provided so as to interpose the plurality of light emitting elements and the plurality of light receiving elements,
wherein the light receiving element is a surface-incident type light receiving element,
wherein a mounting surface of a carrier that mounts the light receiving element is inclined, and the light receiv- ing surface of the light receiving element is disposed so as to be inclined with respect to the optical axis of the output light, and wherein the second region is located on the opposite side of the light emitting element as viewed from the carrier.

2. The optical transmitter according to claim 1, further comprising:

an optical wave combiner which is mounted on the housing, to which the output lights of the plurality of light emitting elements are input from a plurality of input ends provided on one side, which wave-combines the input output lights, and which outputs the wave-combined light to one output end which is provided on the other side facing the one side and disposed at a position offset from a center on the other side; and an optical inlet which is provided in the housing, into which the wave-combined light output from the output end of the optical wave combiner is introduced, and which is disposed in a vicinity of the center of the width of the housing.

3. The optical transmitter according to claim 2, wherein a width of the first direction of the connection region is smaller than a width of the first direction of the first region and a width of the first direction of the second region, and wherein the connection region of the wiring board is disposed in a region where the plurality of light emitting elements and the plurality of light receiving elements are not disposed on a surface of the housing by offsetting the plurality of light emitting elements and the plurality of light receiving elements at positions corresponding to the input ends of the optical wave combiner.

4. The optical transmitter according to claim 1, wherein the second region is disposed at a position lower than the first region, and wherein a thickness of the wiring board in the first region and a thickness of the wiring board in the second region are the same, and the connection region has a step difference or an inclination.

5. The optical transmitter according to claim 2, wherein the optical inlet is disposed on the side of the wiring board where the connection region is located from the center of the width of the housing.

6. An optical transmitter comprising:

a plurality of light emitting elements;

a plurality of light receiving elements that monitor output lights from the respective plurality of light emitting elements;

a housing that mounts the plurality of light emitting elements and the plurality of light receiving elements;

a wiring board which is mounted on the housing and which is provided with a first region having a first pad electrically connected to the light emitting element, a second region having a second pad electrically connected to the light receiving element, and a connection region which connects the first region and the second region to each other; and a cover that covers the housing;

wherein the plurality of light emitting elements and the plurality of light receiving elements are disposed so as to be aligned along a first direction intersecting the optical axis, where the first region and the second region are provided so as to interpose the plurality of light emitting elements and the plurality of light receiving elements, wherein the housing has a guide pin that determines a position of the cover relative to the housing, wherein the wiring board has an extension region that is on an extension line of the connection region and extends from the second region along a second direction that intersects the first direction, and wherein a hole into which the guide pin is inserted is formed in the extension region.

7. The optical transmitter according to claim 1, wherein the second pad in the second region of the wiring board is provided at a position deviated from an optical axis of the output light from the light emitting element.

8. The optical transmitter according to claim 7, wherein the second pad is provided on an outer side of the first direction of the housing of the optical axis in the second region of the wiring board.

9. The optical transmitter according to claim 6, wherein the light receiving element is a surface-incident type light receiving element, wherein a mounting surface of a carrier that mounts the light receiving element is inclined, and the light receiving surface of the light receiving element is disposed so as to be inclined with respect to the optical axis of the output light, and wherein the second region is located on the opposite side of the light emitting element as viewed from the carrier.

10. An optical device comprising:

a plurality of first optical elements;

a plurality of second optical elements that are optically coupled to the plurality of first optical elements;

a housing that mounts the plurality of first optical elements and the plurality of second optical elements;

a wiring board which is mounted on the housing and which is provided with a first region having a first pad electrically connected to the first optical element, a second region having a second pad electrically connected to the second optical element, and a connection region which connects the first region and the second region to each other;

a receptacle provided in the housing and disposed in a vicinity of a center of the width of the housing; and an optical component which is mounted on the housing and which has a plurality of first ends which are provided on one side and optically coupled to the plurality of first optical elements and a second end which is provided on other side facing the one side and disposed at a position offset from a center of the other side, and is optically coupled to the receptacle wherein the plurality of first optical elements and the plurality of second optical elements are disposed so as to be aligned along the first direction intersecting the optical axis, and wherein the first region and the second region are provided so as to interpose the plurality of first optical elements and the plurality of second optical elements.

11. The optical device according to claim 10, wherein a width of the first direction of the connection region is smaller than a width of the first direction of the first region and a width of the first direction of the second region, and wherein the connection region of the wiring board is disposed in a region where the plurality of first optical element and the second optical element are not disposed on a surface of the housing by offsetting the plurality of first optical elements and the second optical elements at positions corresponding to the first ends of the optical component.

12. The optical transmitter according to claim 6, further comprising:

an optical wave combiner which is mounted on the housing, to which the output lights of the plurality of light emitting elements are input from a plurality of input ends provided on one side, which wave-combines the input output lights, and which outputs the wave-combined light to one output end which is provided on the other side facing the one side and disposed at a position offset from a center on the other side; and an optical inlet which is provided in the housing, into which the wave-combined light output from the output end of the optical wave combiner is introduced, and which is disposed in a vicinity of the center of the width of the housing.

13. The optical transmitter according to claim 12, wherein a width of the first direction of the connection region is smaller than a width of the first direction of the first region and a width of the first direction of the second region, and wherein the connection region of the wiring board is disposed in a region where the plurality of light emitting elements and the plurality of light receiving elements are not disposed on a surface of the housing by offsetting the plurality of light emitting elements and the plurality of light receiving elements at positions corresponding to the input ends of the optical wave combiner.

14. The optical transmitter according to claim 6, wherein the second region is disposed at a position lower than the first region, and wherein a thickness of the wiring board in the first region and a thickness of the wiring board in the second region are the same, and the connection region has a step difference or an inclination.

15. The optical transmitter according to claim 12, wherein the optical inlet is disposed on the side of the wiring board where the connection region is located from the center of the width of the housing.

16. The optical transmitter according to claim 6, wherein the second pad in the second region of the wiring board is provided at a position deviated from an optical axis of the output light from the light emitting element.

17. The optical transmitter according to claim 16, wherein the second pad is provided on an outer side of the first direction of the housing of the optical axis in the second region of the wiring board.

* * * * *